United States Patent
Jung et al.

(10) Patent No.: US 7,564,393 B2
(45) Date of Patent: Jul. 21, 2009

(54) DIGITAL TO ANALOG CONVERTER AND METHOD FOR DIGITAL TO ANALOG CONVERSION

(75) Inventors: Ji Woon Jung, Gwangmyeong-si (KR); Ju Hyun Ko, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/940,508

(22) Filed: Nov. 15, 2007

(65) Prior Publication Data
US 2008/0191918 A1 Aug. 14, 2008

(30) Foreign Application Priority Data
Feb. 13, 2007 (KR) ............... 10-2007-0014735

(51) Int. Cl.
*H03M 1/66* (2006.01)
(52) U.S. Cl. ..................... 341/150; 341/144
(58) Field of Classification Search ........... 341/144, 341/150, 154
See application file for complete search history.

(56) References Cited

U.S. PATENT DOCUMENTS 6,229,472 B1* 5/2001 Nishida .................. 341/161
6,992,509 B2* 1/2006 Ko et al. .................. 327/96
2008/0094272 A1* 4/2008 Horie ...................... 341/158
2008/0122457 A1* 5/2008 Taguchi ................... 324/679

FOREIGN PATENT DOCUMENTS

| JP | 93-18670 | 8/1993 |
|---|---|---|
| JP | 09-244590 | 9/1997 |
| JP | 2000-013234 | 1/2000 |
| JP | 2000-200069 | 7/2000 |
| JP | 2005-070627 | 3/2005 |
| KR | 1020020084933 A | 11/2002 |

* cited by examiner

*Primary Examiner*—Peguy JeanPierre
(74) *Attorney, Agent, or Firm*—Volentine & Whitt, P.L.L.C.

(57) ABSTRACT

A digital to analog converter includes first and second capacitors, an operational amplifier and a switching circuit. The operational amplifier includes first and second input terminals and an output terminal, the second input terminal receiving a reference voltage. The switching circuit includes multiple switches which switch in response to corresponding switching signals. The switching circuit connects the second capacitor between the output terminal and the first input terminal of the operational amplifier, while respectively sending first and second voltages to first and second terminals of the first capacitor during a first period. The switching circuit also connects the first capacitor between the output terminal and the first input terminal of the operational amplifier, while respectively sending third and fourth voltages to first and second terminals of the second capacitor during a second period consecutively following the first period.

17 Claims, 4 Drawing Sheets

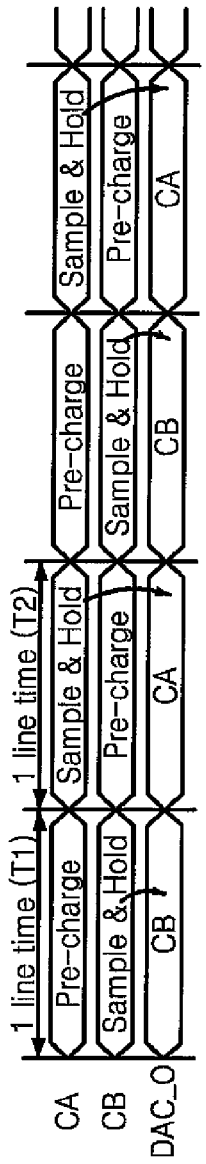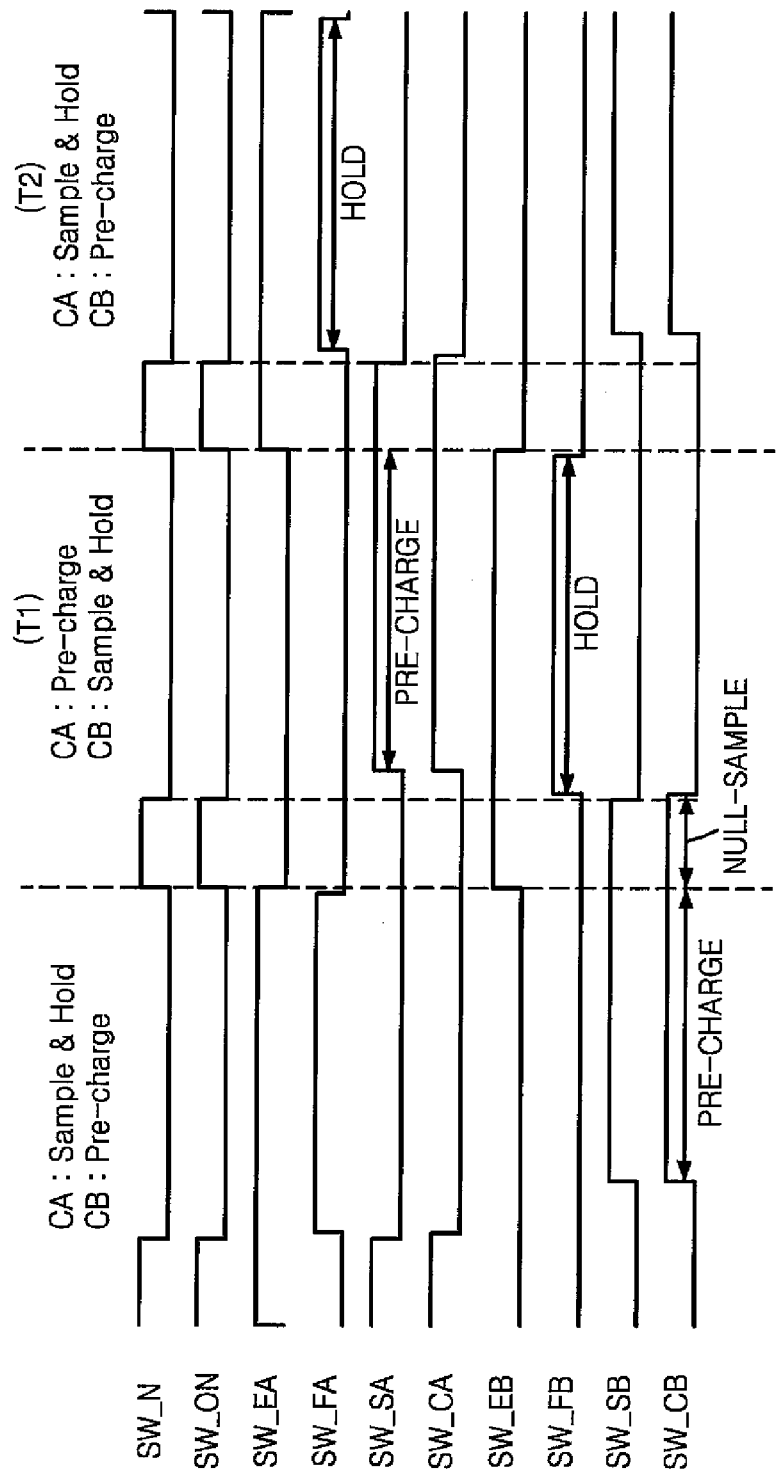
FIG. 3A
FIG. 3B

DIGITAL TO ANALOG CONVERTER AND METHOD FOR DIGITAL TO ANALOG CONVERSION

CROSS-REFERENCE TO RELATED PATENT APPLICATIONS

A claim of priority is made to Korean Patent Application No. 10-2007-0014735, filed on Feb. 13, 2007, the subject matter of which is hereby incorporated by reference.

BACKGROUND OF THE INVENTION

1. Field of the Invention

The present invention relates to digital to analog conversion, and more particularly, to a digital to analog converter and a method of performing digital to analog conversion.

2. Description of the Related Art

FIG. 1 illustrates a circuit diagram of a conventional digital to analog converter. Referring to FIG. 1, the digital to analog converter (DAC) 10 includes a signal conversion block 12 and two sample-hold amplifiers 18 and 20.

The signal conversion block 12 includes a resistor string 14 connected between a first node receiving a first reference voltage Vref1 and a second node receiving a second reference voltage Vref2, where Vref2 may be smaller than Vref1, for generating multiple voltages. A selection circuit 16 outputs one of the voltages as a select voltage DECO in response to an input digital signal DATA.

The sample-hold amplifier 18 includes a sampling capacitor C1, multiple switches SW_SA, SW_NA and SW_FA, and an operational amplifier OP AMP. The sample-hold amplifier 20 includes a sampling capacitor C2, multiple switches SW_SB, SW_NB and SW_FB, and an operational amplifier OP AMP. The capacitors C1 and C2 may have the same capacitance or different capacitances.

To secure an RC time by a resistor value R of the signal conversion block 12 and a capacitance C of each capacitor C1 or C2 of the two sample-hold amplifiers 18 and 20, a channel driver (e.g., a DAC 10) embodied in each channel of a source driver requires the two sample-hold amplifiers 18 and 20 for outputting an output signal in every "line time," which refers to the time for scanning a gate line.

Accordingly, the DAC 10 outputs a signal, which is held by a holding operation HOLD of the sample-hold amplifier 20, as an output signal DACB, while the sample-hold amplifier 18 performs a sampling operation SAMPLE during a first line time. The DAC 10 outputs a signal, which is held by a holding operation HOLD of the sample-hold amplifier 18, as an output signal DACA, while the sample-hold amplifier 20 performs a sampling operation SAMPLE during a second line time, which occurs after the first line time. In other words, the DAC 10 alternately outputs the output signals DACA and DACB of the two sample-hold amplifiers 18 and 20 in turn.

The conventional DAC 10 illustrated in FIG. 1 requires two sample-hold amplifiers 18 and 20, each of which consumes power. Also, each of the sample-hold amplifiers 18 and 20 includes an operational amplifier OP AMP, which is large and consumes a significant amount of static current.

SUMMARY OF THE INVENTION

An aspect of the present invention provides an integrated circuit for digital to analog conversion, including a first capacitor and a second capacitor, an operational amplifier and a switching circuit. The operational amplifier includes a first input terminal, a second input terminal and an output terminal. The second input terminal receives a reference voltage. The switching circuit includes multiple switches, each switch being configured to switch in response to a corresponding switching signal. The switching circuit is configured to connect the second capacitor between the output terminal and the first input terminal of the operational amplifier while sending a first voltage to a first terminal of the first capacitor and a second voltage to a second terminal of the first capacitor during a first period. The switching circuit is also configured to connect the first capacitor between the output terminal and the first input terminal of the operational amplifier while sending a third voltage to a third terminal of the second capacitor and a fourth voltage to a fourth terminal of the second capacitor during a second period consecutively following the first period.

The switching circuit may be further configured to separate the second capacitor from the output terminal of the operational amplifier before the second period starts. Also, the switching circuit may separate the first capacitor from the output terminal of the operational amplifier before a third period starts, where the third period consecutively follows the second period.

The integrated circuit may further include a resistor string connected between a first node for receiving a first reference voltage and a second node for receiving a second reference voltage. The resistor string generates multiple voltages. The integrated circuit may also include a selection circuit that outputs one of the multiple voltages as the first voltage or the third voltage in response to an input digital signal. The first voltage may be the same as the third voltage.

The integrated circuit may further include a controller for outputting the switching signals. Also, the integrated circuit may include a third capacitor connected between an output of the switching circuit and the first input terminal of the operational amplifier. The third capacitor cancels an offset of the operational amplifier. The integrated circuit may be one of a switched capacitor amplifier or a digital to analog converter, and may be part of a source driver.

A display device may include multiple cells and a source driver containing the integrated circuit for digital to analog conversion, described above. Each cell is connected between a corresponding data line of multiple data lines and a corresponding gate line of multiple gate lines. A voltage of the output terminal of the operational amplifier of the integrated circuit may be supplied to a corresponding data line among the multiple data lines. Also, the integrated circuit of the source driver may include a resistor string connected between a first node for receiving a first reference voltage and a second node for receiving a second reference voltage, the resistor string generating multiple voltages. A selection circuit outputs one of the voltages as the first voltage or the third voltage in response to an input digital signal.

Another aspect of the present invention provides an integrated circuit for digital to analog conversion, including an operational amplifier having first and second input terminals and an output terminal, the second input terminal receiving a reference voltage. The integrated circuit also includes a first capacitor having first and second terminals and a second capacitor having third and fourth terminals. A first switch selectively sends a first voltage to the first terminal; a second switch selectively sends a second voltage to the second terminal; a third switch selectively sends a third voltage to the third terminal; and a fourth switch selectively sends a fourth voltage to the fourth terminal. A fifth switch is connected between the second terminal and the first input terminal of the operational amplifier; a sixth switch is connected between the fourth terminal and the first input terminal of the operational amplifier; a seventh switch is connected between the first terminal and the output terminal of the operational amplifier; and an eighth switch is connected between the third terminal and the output terminal of the operational amplifier. The sixth switch and the eighth switch connect the second capacitor between the first input terminal and the output terminal of the operational amplifier while the first voltage is sent to the first terminal and the second voltage is sent to the second terminal. The fifth switch and the seventh switch connect the first capacitor between the first input terminal and the output terminal of the operational amplifier while the third voltage is sent to the third terminal and the fourth voltage is sent to fourth terminal.

The integrated circuit may further include a third capacitor connected between the fifth switch and the first input terminal of the operational amplifier for canceling an offset of the operational amplifier. The integrated circuit may also include a ninth switch for sending a fifth voltage to the first input terminal of the operational amplifier, and a tenth switch connected between the first input terminal of the operational amplifier and the output terminal of the operational amplifier. The operational amplifier performs a null operation in response to the ninth switch and the tenth switch being turned on. The second voltage, the fourth voltage and the fifth voltage may be the same as the reference voltage.

The integrated circuit may further include a resistor string and a selection circuit. The resistor string, which generates multiple voltages, may be connected between a first node for receiving a first reference voltage and a second node for receiving a second reference voltage. The selection circuit may output one of the voltages as the first voltage or the third voltage in response to an input digital signal. The first voltage may be the same as the third voltage, and the second voltage and the fourth voltage may be the same as the reference voltage.

Yet another aspect of the present invention provides a digital to analog conversion method. The method includes pre-charging a first input voltage in a first capacitor, while outputting from an operational amplifier a voltage sample-held by a second capacitor, during an odd line time. The method further includes pre-charging a second input voltage in the second capacitor, while outputting from the operational amplifier a voltage sample-held by the first capacitor, during an even line time. The voltage sample-held by the first capacitor is based on the first input voltage pre-charged in the first capacitor during the odd line time.

Also, the method may include generating multiple voltages using a resistor string based on multiple reference voltages. One of the voltages may be output as one of the first input voltage and the second input voltage in response to an input digital signal.

BRIEF DESCRIPTION OF THE DRAWINGS

The accompanying drawings are included to provide a further understanding of the invention. The drawings illustrate example embodiments of the present invention, described with reference to the attached drawings, in which:

FIG. 3A is a timing diagram for an operation mode of the DAC, according to an example embodiment of the present invention;

FIG. 3B illustrates a timing diagram for switching signals, according to an example embodiment of the present invention.

DETAILED DESCRIPTION OF THE EMBODIMENTS

Figure 1:
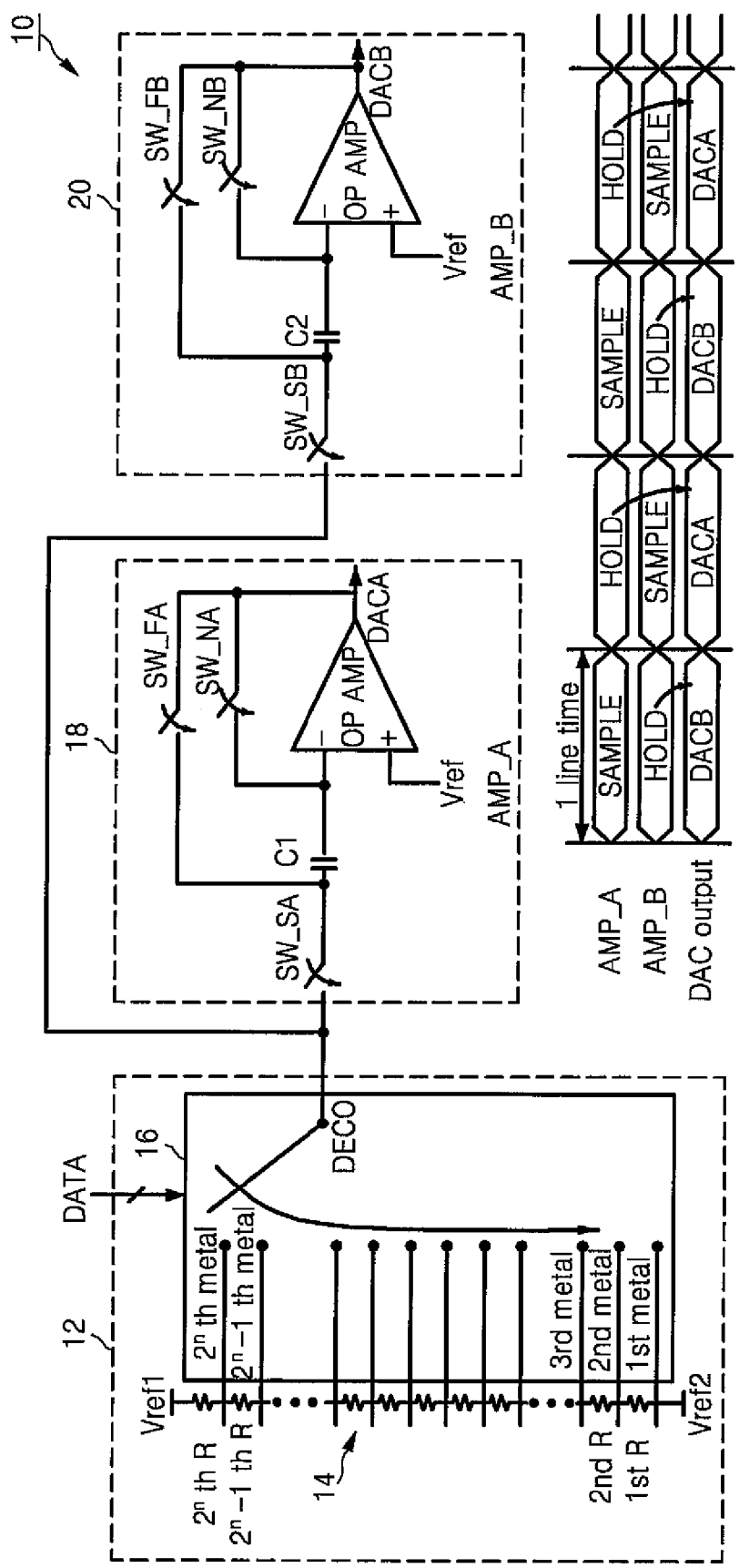
FIG. 1 illustrates a circuit diagram of a conventional digital to analog converter (DAC)

The present invention will now be described more fully with reference to the accompanying drawings, in which illustrative embodiments of the invention are shown. Specific structural and functional details disclosed herein are merely representative for purposes of describing example embodiments of the present invention. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 2:
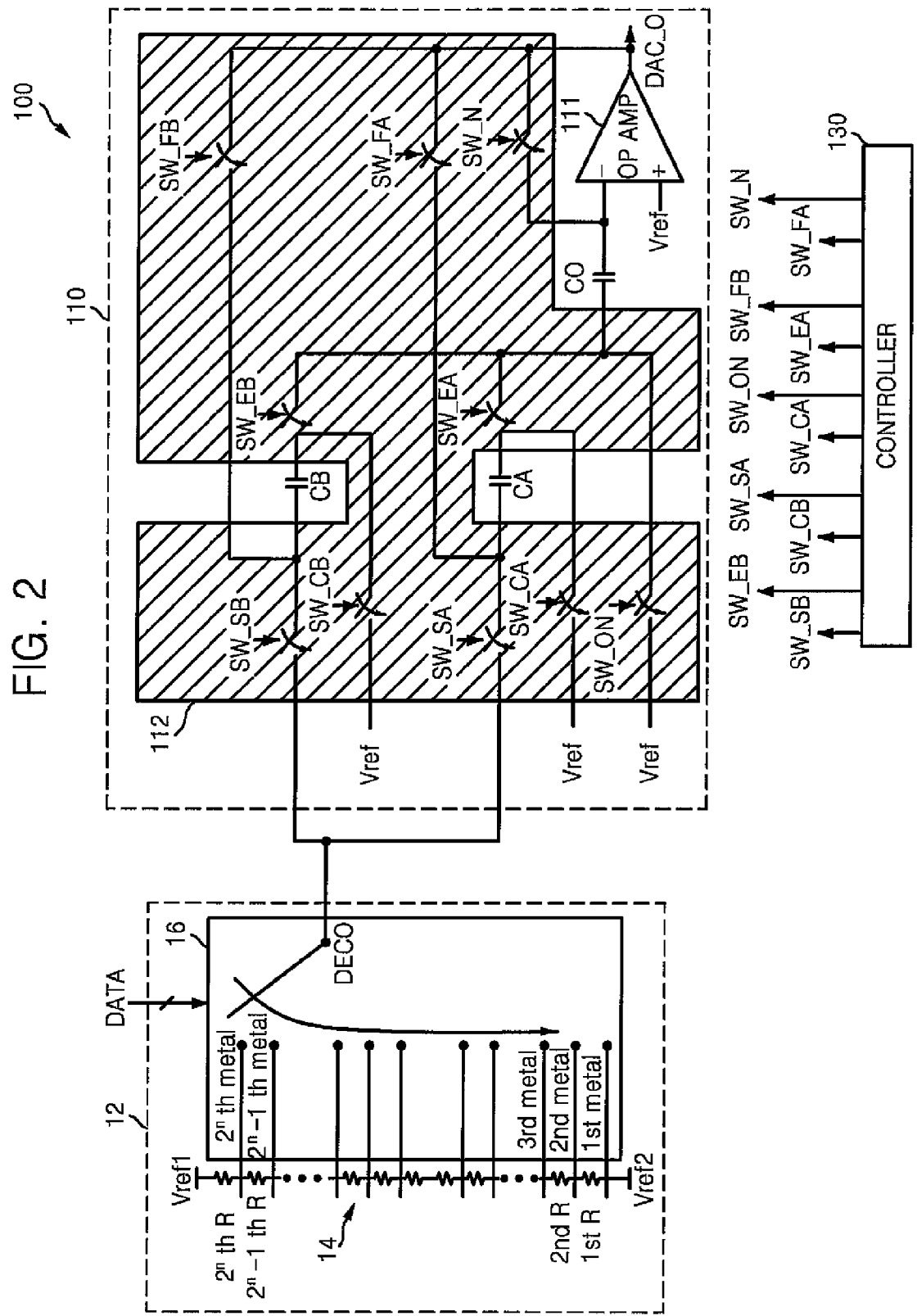
FIG. 2 illustrates a circuit diagram of a DAC, according to an example embodiment of the present invention.

FIG. 2 is a circuit diagram of a digital to analog converter 100 according to an exemplary embodiment of the present invention. Referring to FIG. 2, the digital to analog converter (DAC) 100, which can be embodied as an integrated circuit, includes an amplifier 110, which may be referred to as a switched capacitor amplifier. The amplifier 110 includes a first capacitor CA, a second capacitor CB, an operational amplifier 111 and a switching circuit (or switch arrangement) 112. The DAC 100 may also be referred to as a resistor-capacitor DAC (RC-DAC).

The operational amplifier 111 includes a first input terminal (e.g., a negative (−) input terminal), a second input terminal (e.g., positive (+) input terminal) and an output terminal. The second input terminal receives a reference voltage Vref, and the output terminal outputs an output signal DAC_O.

The switching circuit 112 includes multiple first switches respectively switched in response to corresponding switching signals among multiple first switching signals SW_SA, SW_CA, SW_SB, SW_CB, SW_EA, SW_EB, SW_FA and SW_FB. The switching circuit 112 may further include multiple second switches respectively switched in response to corresponding switching signals among second switching signals SW_ON and SW_N.

The first switches and the second switches may be respectively embodied as metal oxide semiconductor (MOS) transistors, although the first switches and second switches may be embodied using any suitable components, without departing from the spirit and scope of the present invention. Referring to FIGS. 2 to 3b, those skilled in the art will appreciate the connection and operation the first switches and second switches, respectively.

The DAC 100 may further include a controller 130 which generates the first switching signals SW_SA, SW_CA, SW_SB, SW_CB, SW_EA, SW_EB, SW_FA and SW_FB and the second switching signals SW_ON and SW_N.

For example, for an odd line time (or an odd period), responsive to each level of the first switching signals SW_SA, SW_CA, SW_SB, SW_CB, SW_EA, SW_EB, SW_FA and SW_FB illustrated in FIG. 3b, the switching circuit 112 may connect the second capacitor CB between an output terminal of the operational amplifier 111 and a first input terminal, e.g., the negative (−) input terminal, while the switching circuit 112 sends a first voltage, e.g., DECO, to a first terminal of the first capacitor CA and a second voltage, e.g., Vref, to a second terminal of the first capacitor CA. In the example, a switch may be turned on when a level of a switching signal is high and the switch may be turned off when a level of the switching signal is low.

In addition, during an even line time (or an even period), based on each level of the first switching signals SW_SA, SW_CA, SW_SB, SW_CB, SW_EA, SW_EB, SW_FA and SW_FB illustrated in FIG. 3b, the switching circuit 112 may connect the first capacitor CA between the output terminal of the operational amplifier 111 and the first input terminal, e.g. the negative (−) input terminal, while the switching circuit 112 sends a third voltage, e.g., DECO, to a third terminal of the second capacitor CB and a fourth voltage, e.g., Vref, to a fourth terminal of the second capacitor CB.

The DAC 100 may further include a signal conversion block 12. The signal conversion block 12 includes a resistor string 14 and a selection circuit 16. The resistor string 14, which includes multiple resistors connected in series, is connected between a first node receiving a first reference voltage Vref1 and a second node receiving a second reference voltage Vref2 (e.g., Vref1>Vref2) for generating multiple voltages. Each resistor value of the resistors forming the resistor string 14 may be the same as or different from one another, without departing from the spirit and scope of the present invention.

Figure 4:
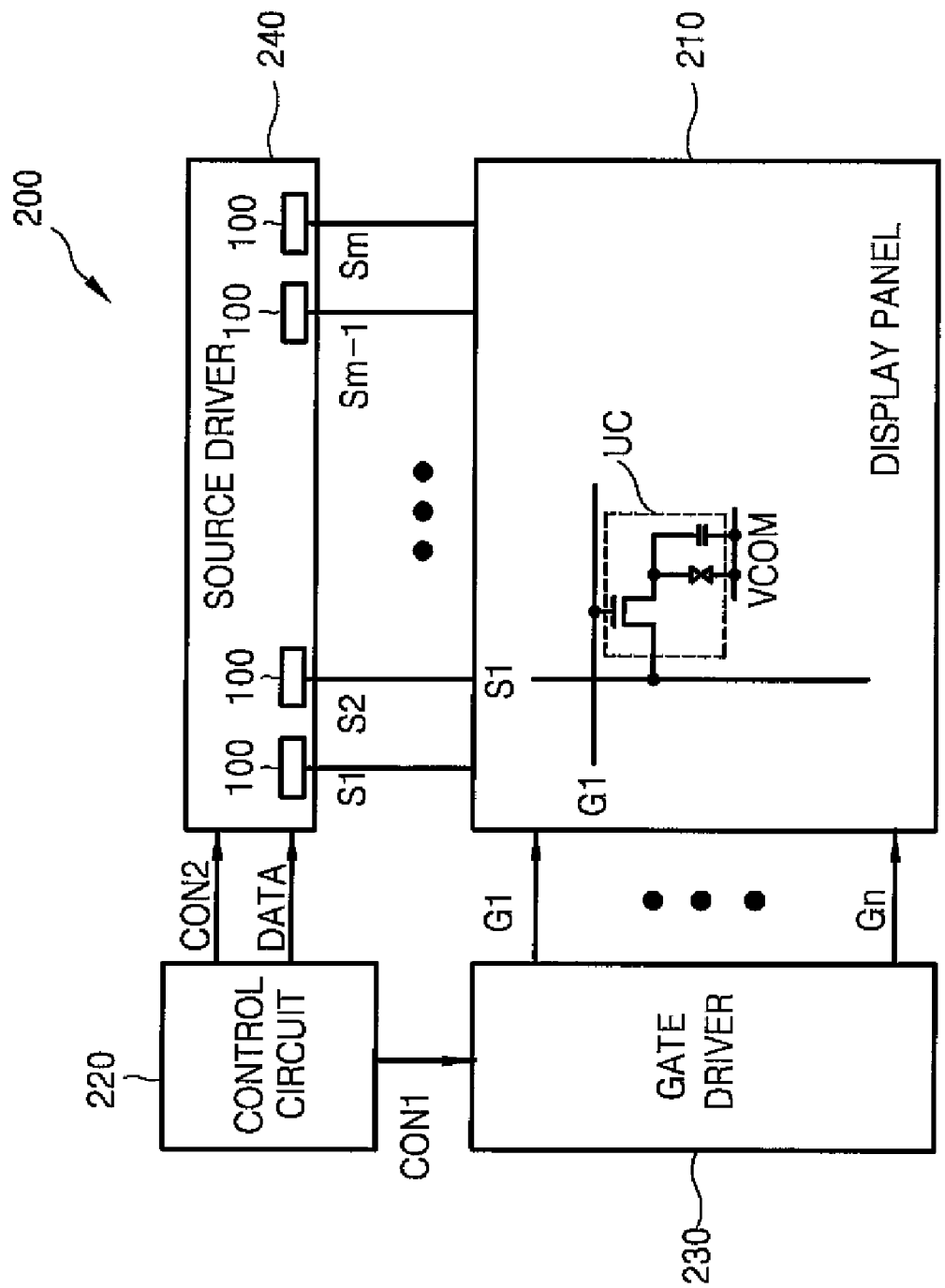
FIG. 4 illustrates a block diagram of a display device, which includes a source driver having a DAC illustrated in FIG. 2, according to an example embodiment of the present invention.

Here, the second voltage and the fourth voltage may be the same voltage as the reference voltage Vref, which is input to the second input terminal, e.g., the positive (+) input terminal, of the operational amplifier 111. In an embodiment, the reference voltage Vref may be one-half of a difference between the first reference voltage Vref1 and the second reference voltage Vref2, for example, although not necessarily so. Also, when the DAC 100 is used in a display device, the reference voltage Vref may be a common voltage VCOM supplied to a unit cell UC as illustrated in FIG. 4.

The selection circuit 16 outputs one of the multiple voltages as an output signal DECO in response to an input digital signal DATA. For example, the output signal DECO may be an analog signal dependent on the digital signal DATA. Also, the digital signal DATA may be an n-bit parallel image signal, where n is a natural number. The selection circuit 16 may be embodied as a decoder or a multiplexer, for example.

The DAC 100 may further include a third capacitor CO, connected between an output terminal of the switching circuit 112 and the first input terminal, e.g., the negative (−) input terminal, of the operational amplifier 111. The third capacitor CO can be used for canceling offset of the operational amplifier 111.

FIG. 3A is a timing diagram for an operation mode of the digital to analog converter 100 according to an exemplary embodiment of the present invention, and FIG. 3B is a timing diagram of the switching signals according to an exemplary embodiment of the present invention. Referring to FIGS. 2 to 3B, the second capacitor CB is used as a pre-charge capacitor by the switching circuit 112 before the first line time (or a first period) T1, so that an electrical charge in proportion to a voltage difference between a voltage DECO output by the selection circuit 16 and a fourth voltage, e.g., Vref, is charged in the second capacitor CB.

The second capacitor CB is pre-charged with predetermined electrical charges during the PRE_CHARGE section. Therefore, the second capacitor CB, which performs a pre-charge operation and/or a sampling operation, may be referred to as a pre-charge capacitor. At the beginning of a first line time T1 (e.g., after the predetermined electrical change is pre-charged in the pre-charge capacitor), the operational amplifier 111 performs a null operation by switches respectively turned on in response to the switching signals SW_N and SW_ON. Accordingly, the null operation cancels offset of the operational amplifier 111. Canceling the offset means that the output signal DAC_O of the operational amplifier 111 is not affected by the offset, although canceling the offset may include other affects.

The section of FIG. 3B indicating the null operation is referred to as a null-sample section NULL-SAMPLE in the first line time T1. In the NULL-SAMPLE section, a voltage corresponding to a voltage difference between an output voltage DECO and the fourth voltage, e.g., Vref, is sampled in the second capacitor CB.

Next, the second capacitor CB is connected between an output terminal of the operational amplifier 111 and the first input terminal by a switch turned on in response to a switching signal SW_FB. This is indicated in FIG. 3B as a hold section HOLD of the switching signal SW_FB in the first line time T1. During the HOLD section, the operational amplifier 111 outputs a voltage, which is generated by an electrical charge held at the second capacitor CB, as an output voltage DAC_O. Therefore, the second capacitor CB performing the sampling and holding in the first line time T1 operates as a sample-hold capacitor.

During the HOLD section of the switching signal SW_FB, the first capacitor CA is charged with an electrical charge in proportion to a voltage difference between a voltage DECO output from a selection circuit 16 and a second voltage, e.g., Vref. Here, a PRE_CHARGE section for the first capacitor CA and the HOLD section of the second capacitor CB may substantially overlap each other.

As described above, during the first line time T1, the first capacitor CA is used as a pre-charge capacitor and the second capacitor CB is used as a sample-hold capacitor by a switching circuit 112. In comparison, during a second line time T2 (or a second period), the first capacitor CA is used as a sample-hold capacitor and the second capacitor is used as a pre-charge capacitor by the switching circuit 112.

In other words, during an odd line time (or an odd period) including a first line time T1, a first capacitor CA is used as a pre-charge capacitor and a second capacitor is used as a sample-hold capacitor. During a subsequent line time, i.e., an even line time (or an even period) including a second line time T2, the second capacitor CB is used as a pre-charge capacitor and the first capacitor CA is used as a sample-hold capacitor. The process may be repeated for consecutively occurring line times. As described above, the DAC 100, according to exemplary embodiments of the present invention, is able to perform sample-hold functions during line time T1 or T2, so the DAC 100 may embody a channel driver having only one operational amplifier 111.

Further, in an embodiment, the second capacitor CB, which functions as a sample-hold capacitor in the first line time T1, may be separated from the output terminal of the operational amplifier 111, for example, in response to the switching signal SW_FB, before the start of the next period (i.e., the second line time T2). Likewise, when the first capacitor CA functions as a sample-hold capacitor, it may be separated from the output terminal of the operational amplifier 111, for example, in response to the switching signal SW_FA, before the next consecutive period begins.

FIG. 4 illustrates a block diagram of a display device 200 including a source driver 240 having at least one digital to analog converter 100 illustrated in FIG. 2. Referring to FIG. 4, a flat display device 200, such as a thin film transistor-liquid crystal display (TFT-LCD), a plasma display panel (PDP) or an organic light emitting diode (OLED), includes a display panel 210, a control circuit 220, a gate driver 230 and a source (or data line) driver 240.

The display panel 210 includes data lines S1 to Sm, where m is a natural number, gate lines G1 to Gn, where n is a natural number, n=m or n≠m, and unit cells including an exemplary unit cell UC. The unit cells are respectively connected between a corresponding data line among the data lines S1 to Sm and a corresponding gate line among the gate lines G1 to Gn.

The control circuit 220 generates control signals including a first control signal CON1 and a second control signal CON2. For example, the control circuit 220 may generate the first control signal CON1, the second control signal CON2 and data DATA based on a horizontal synchronization signal and a vertical synchronization signal. The gate driver 230 drives gate lines G1 to Gn successively in response to the first control signal CON1. For example, the first control signal CON1 may be an indication signal indicating a start of scanning gate lines.

The source driver 240 may include one or more digital to analog converters 100. The source driver 240 drives the source lines S1 to Sm in response to a second control signal CON2 output from the control circuit 220 and digital image data DATA.

A digital to analog conversion method according to an exemplary embodiment of the present invention, e.g., as depicted in FIG. 3B, includes an input voltage DECO being pre-charged in a first capacitor CA while an operational amplifier 111 compares a voltage sampled and held in a second capacitor CB with a reference voltage Vref, or while the operational amplifier 111 outputs the voltage sampled and held in the second capacitor CB, during an odd line time. The method further includes an input voltage DECO being pre-charged in the second capacitor CB while the operational amplifier 111 compares a voltage sampled and held (after being pre-charged) in the first capacitor CA with the reference voltage Vref, or while the operational amplifier 111 outputs the voltage sampled and held (after being pre-charged) in the first capacitor CA, during an even line time.

In addition, a voltage corresponding to a difference between an input voltage DECO and a reference voltage may be alternately pre-charged in the first capacitor CA and the second capacitor CB. Also, in an embodiment, a source driver module (not shown) may include multiple source drivers having the same structure as the source driver 240 illustrated in FIG. 4.

As described above, a digital to analog converter having one amplifier, according to exemplary embodiments of the present invention, consumes significantly less power than conventional systems. Also, the digital to analog converter (or the amplifier), according to exemplary embodiments of the present invention, has only one operational amplifier, and thus occupies less layout space than conventional systems. The digital to analog converter may be included in a source driver.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An integrated circuit for digital to analog conversion, comprising:
   a first capacitor and a second capacitor;
   an operational amplifier comprising a first input terminal, a second input terminal and an output terminal, the second input terminal receiving a reference voltage; and
   a switching circuit comprising a plurality of switches, each switch being configured to switch in response to a corresponding switching signal of a plurality of switching signals,
   wherein the switching circuit is configured to connect the second capacitor between the output terminal and the first input terminal of the operational amplifier while sending a first voltage to a first terminal of the first capacitor and a second voltage to a second terminal of the first capacitor during a first period, and
   wherein the switching circuit is configured to connect the first capacitor between the output terminal and the first input terminal of the operational amplifier while sending a third voltage to a first terminal of the second capacitor and a fourth voltage to a second terminal of the second capacitor during a second period consecutively following the first period.

2. The integrated circuit of claim 1, wherein the switching circuit is further configured to separate the second capacitor from the output terminal of the operational amplifier before the second period starts, and to separate the first capacitor from the output terminal of the operational amplifier before a third period starts, the third period consecutively following the second period.

3. The integrated circuit of claim 1, further comprising:
   a resistor string connected between a first node for receiving a first reference voltage and a second node for receiving a second reference voltage, the resistor string generating a plurality of voltages; and
   a selection circuit for outputting one of the plurality of voltages as the first voltage or the third voltage in response to an input digital signal.

4. The integrated circuit of claim 1, wherein the first voltage is the same as the third voltage.

5. The integrated circuit of claim 1, further comprising:
   a controller for outputting the plurality of switching signals.

6. The integrated circuit of claim 1, further comprising:
   a third capacitor connected between an output terminal of the switching circuit and the first input terminal of the operational amplifier, the third capacitor canceling an offset of the operational amplifier.

7. The integrated circuit of claim 1, wherein the integrated circuit is one of a switched capacitor amplifier or a digital to analog converter.

8. The integrated circuit of claim 1, wherein the integrated circuit is part of a source driver.

9. A display device comprising:
   a plurality of cells, each cell being connected between a corresponding data line of a plurality of data lines and a corresponding gate line of a plurality of gate lines; and
   a source driver comprising the integrated circuit of claim 1, wherein a voltage of the output terminal of the operational amplifier of the integrated circuit is supplied to a corresponding data line among the plurality of data lines.

10. The display device of claim 9, wherein the integrated circuit further comprises:
    a resistor string connected between a first node for receiving a first reference voltage and a second node for receiving a second reference voltage, the resistor string generating a plurality of voltages; and a selection circuit for outputting one of the plurality of voltages as the first voltage or the third voltage in response to an input digital signal.

11. An integrated circuit for digital to analog conversion, comprising:

an operational amplifier comprising a first input terminal, a second input terminal and an output terminal, the second input terminal receiving a reference voltage;

a first capacitor comprising a first terminal and a second terminal;

a second capacitor comprising a third terminal and a fourth terminal;

a first switch for selectively sending a first voltage to the first terminal;

a second switch for selectively sending a second voltage to the second terminal;

a third switch for selectively sending a third voltage to the third terminal;

a fourth switch for selectively sending a fourth voltage to the fourth terminal;

a fifth switch connected between the second terminal and the first input terminal of the operational amplifier;

a sixth switch connected between the fourth terminal and the first input terminal of the operational amplifier;

a seventh switch connected between the first terminal and the output terminal of the operational amplifier; and an eighth switch connected between the third terminal and the output terminal of the operational amplifier, wherein the sixth switch and the eighth switch connect the second capacitor between the first input terminal and the output terminal of the operational amplifier while the first voltage is sent to the first terminal and the second voltage is sent to the second terminal, and wherein the fifth switch and the seventh switch connect the first capacitor between the first input terminal and the output terminal of the operational amplifier while the third voltage is sent to the third terminal and the fourth voltage is sent to fourth terminal.

12. The integrated circuit of claim 11, further comprising:
a third capacitor connected between the fifth switch and the first input terminal of the operational amplifier, the third capacitor canceling an offset of the operational amplifier.

13. The integrated circuit of claim 11, further comprising:

a ninth switch for sending a fifth voltage to the first input terminal of the operational amplifier; and a tenth switch connected between the first input terminal of the operational amplifier and the output terminal of the operational amplifier, wherein the operational amplifier performs a null operation in response to the ninth switch and the tenth switch being turned on.

14. The integrated circuit of claim 13, wherein the second voltage, the fourth voltage and the fifth voltage are the same as the reference voltage.

15. The integrated circuit of claim 11, further comprising:

a resistor string connected between a first node for receiving a first reference voltage and a second node for receiving a second reference voltage, the resistor string generating a plurality of voltages; and a selection circuit for outputting one of the plurality of voltages as the first voltage or the third voltage in response to an input digital signal.

16. The integrated circuit of claim 11, wherein the first voltage is the same as the third voltage, and wherein the second voltage and the fourth voltage are the same as the reference voltage.

17. A digital to analog conversion method, comprising:

pre-charging a first input voltage in a first capacitor, while outputting from an operational amplifier a voltage sample-held by a second capacitor, during an odd line time;

pre-charging a second input voltage in the second capacitor, while outputting from the operational amplifier a voltage sample-held by the first capacitor, during an even line time, the voltage sample-held by the first capacitor being based on the first input voltage pre-charged in the first capacitor during the odd line time;

generating a plurality of voltages using a resistor string based on a plurality of references voltages; and outputting one of the plurality of voltages as one of the first input voltage and the second input voltage in response to an input digital signal.

* * * * *